United States Patent [19]

Tamura

[11] Patent Number: 5,753,415
[45] Date of Patent: May 19, 1998

[54] APPARATUS FOR PIECE-BY-PIECE DEVELOPMENT CORRESPONDING TO LARGE SCALE SUBSTRATES

[75] Inventor: Hideo Tamura, Nagahama, Japan

[73] Assignee: Canon Kabushiki Kaisha, Tokyo, Japan

[21] Appl. No.: 318,517

[22] Filed: Oct. 5, 1994

Related U.S. Application Data

[62] Division of Ser. No. 998,818, Dec. 30, 1992, abandoned.

[30] Foreign Application Priority Data

Jan. 4, 1992 [JP] Japan ................... 4-000007

[51] Int. Cl.⁶ ............................. G03F 7/30
[52] U.S. Cl. ....................... 430/311; 430/325
[58] Field of Search ............... 430/30, 311, 325, 430/329

[56] References Cited

U.S. PATENT DOCUMENTS 3,884,183  5/1975  Sprung, Jr. ................... 118/324
4,938,994  7/1990  Choinski ........................ 427/96

FOREIGN PATENT DOCUMENTS 2194318  2/1974  France.

OTHER PUBLICATIONS

Patent Abstracts of Japan, vol. 13, No. 309 (Jul. 14, 1987) (P-898).

Patent Abstracts of Japan, vol. 12, No. 396 (Oct. 21, 1988) (P-774).

*Primary Examiner*—Kathleen Duda
*Attorney, Agent, or Firm*—Fitzpatrick, Cella, Harper & Scinto

[57] ABSTRACT

A piece-by-piece, passing type development apparatus corresponding to large scale substrates comprises a pipe for ejecting a developing solution and means for applying the developing solution ejected from the pipe onto a substrate as continuous fluid.

3 Claims, 2 Drawing Sheets

APPARATUS FOR PIECE-BY-PIECE DEVELOPMENT CORRESPONDING TO LARGE SCALE SUBSTRATES

This application is a division, of application Ser. No. 07/998,818, filed Dec. 30, 1992, now abandoned.

BACKGROUND OF THE INVENTION

1. Field of the Invention

The present invention relates to an apparatus for development corresponding to large scale substrates for use in the production of liquid crystal display devices, thermal heads, semi conductors, etc.

2. Related Background Art

Apparatuses for development corresponding to large scale substrates for use in the production of liquid crystal display devices, thermal heads, semi conductors, etc. can be classified into two major types: dip-type development apparatuses for developing a plurality of substrates all at once on the one hand and piece-by-piece development apparatus for developing substrates one by one on the other hand.

Well known dip-type development apparatuses include, for example, a batch dip-type development apparatus for conducting a development by placing a plurality of substrates into a cassette and dipping the cassette into a tank containing a developing solution. However, the batch dip-type development apparatuses have the following disadvantages:

1) The most serious disadvantage is a slow tack and consequent low productivity due to the batch treatment. That is, the capacity of the batch dip-type development apparatus is much higher than that of the piece-by-piece development apparatus, because the former apparatus can develop 10 to 20 substrates all at once, but when the whole process including a patterning step is taken into account, the substrates are left untransported in the patterning step because the substrates are obliged to undergo a piece-by-piece light exposure treatment, and consequently total treating capacity is decreased.

2) Since the substrates are left untransported after the application of the developing solution, as mentioned above, bubbles are liable to remain on the resist surface, resulting in undeveloped resist residues being present at a high probability.

3) Particularly in the production of liquid crystal display devices or thermal heads, where large scale substrates, e.g. 300 mm square substrates, are used, it is very difficult to dry the substrates by the batch treatment, and thus drying stains are liable to occur.

Thus, a piece-by-piece type shower development apparatus has been so far widely used as a mass-production apparatus for developing large scale substrates as in the production of liquid crystal display devices or thermal heads owing to the foregoing disadvantages. The piece-by-piece type shower development apparatus conducts the development treatment by feeding substrates one by one to the apparatus, feeding a developing solution in a shower from a nozzle under pressure and ejecting the developing solution onto the substrate, and has the following characteristics: (1) the treating capacity can be adjusted as desired by extending the length of a developing tank through which the substrate passes; (2) after the development drying can be carried out by an air knife and thus no drying stains occur; (3) the developing solution is ejected onto the resist surface, and thus there do not occur undeveloped resist residues.

However, the piece-by-piece type shower development apparatus also has the following disadvantages:

1) Application of a pressure is required because of utilization of the shower phenomenon, and thus particularly fine patterns are sometimes scattered. That is, no fine patterns can be used.

2) The developing solution is applied in a shower state in air, and thus $CO_2$ is liable to be dissolved into the developing solution from air, resulting in deterioration of the developing solution. 3) The developing solution must be exchanged with a high frequency due to the deterioration of the developing solution as mentioned above, resulting in increased consumption of the developing solution.

To overcome these disadvantages, a different system from the conventional system for developing large scale substrates has been proposed. That is, the proposed system is an improvement of the piece-by-piece type shower development system, where the developing solution is provided onto the substrate not by a shower, but by trickling the developing solution from a nozzle. The system is called paddle-type piece-by-piece development system, and is characterized by preventing the deterioration of the developing solution while keeping the advantages of the piece-by-piece type shower system as mentioned above. That is, the developing solution is applied not in a shower form, but in a dropwise form, and thus $CO_2$ is hardly dissolved into the developing solution from air, thereby preventing the deterioration of the developing solution and reducing the consumption of the developing solution.

In the development by the paddle-type piece-by-piece development system, no deterioration of the developing solution has been found as intended, but numbers of short circuits have been unexpectedly found. Detailed inspection of the short circuit phenomena has revealed that the short circuits are due to undeveloped resist residues caused by bubbles attached to the resist, as will be explained below, referring to the drawings.

FIG. 4 is a schematic view showing application of the developing solution onto a substrate by a paddle-type piece-by-piece developing apparatus, where a substrate 3 is transported in the arrow direction D.

FIG. 5 is a schematic view showing a bubble trapped in the applied developing solution by the paddle-type, piece-by-piece development apparatus.

FIG. 6 is a schematic view showing a short circuit in wirings due to the bubble trapping.

The paddle-type, piece-by-piece developing apparatus is designed to apply a developing solution dropwise onto a substrate, as mentioned above. Important factors for applying a developing solution 2 dropwise onto the substrate 3 from a pipe 1 with a nozzle for trickling the developing solution, as shown in FIG. 4 are the flow rate and the discharge pressure of the developing solution and the distance between the substrate and the nozzle. Among these factors, a sufficient distance is given between the substrate and the nozzle to provide for deformation of the substrate and the resulting change in the substrate thickness. Thus, the developing solution is made dropwise by adjusting the flow rate and the discharge pressure of the developing solution.

However, when the developing solution is made dropwise, a bubble 31 is trapped into the applied developing solution 2 as shown in FIG. 5, the bubble 31 partially prevents the substrate 3 from contact with the developing solution 2 to cause a circular undeveloped residue. The undeveloped residue portion is not etched in the successive etching step to cause a short circuit on wirings 33 as shown in FIG. 6, in which numeral 32 designates the short circuit portion.

SUMMARY OF THE INVENTION

An object of the present invention is to overcome these unexpected problems and provide quite a novel development apparatus taking advantage of the piece-by-piece type developing apparatus of high treating capacity.

According to the present invention, there is provided an apparatus for piece-by-piece development corresponding to large scale substrates, capable of applying a developing solution onto the substrate with less trapping of bubbles.

DETAILED DESCRIPTION OF THE PREFERRED EMBODIMENTS

Figure 1:
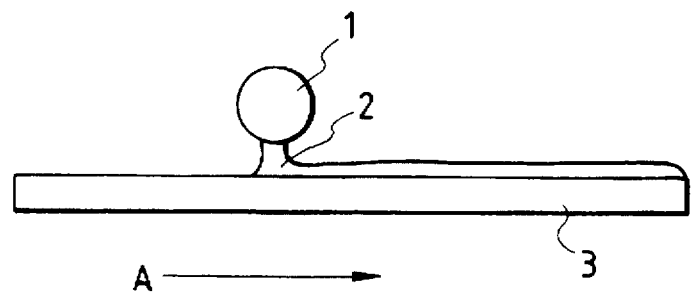
FIG. 1 is a schematic view showing application of a developing solution according to one embodiment of the present apparatus.

The present invention will be explained in detail below, referring to the drawings.

FIG. 1 is a schematic view showing application of a developing solution according to one embodiment of the present apparatus, where numeral 1 is a pipe with a nozzle for applying a developing solution, 2 a developing solution, and 3 a substrate, which is transported in the arrow direction A. By adjusting the flow rate and the discharge pressure of the developing solution 2 and the distance between the substrate 3 and the nozzle, the developing solution 2, which is applied dropwise by the conventional apparatus, is applied as a continuous fluid in the present invention to considerably reduce trapping of bubbles when the developing solution 2 is applied onto the substrate 3.

In the present invention, the distance between the substrate 3 and the nozzle, which has been given more than the necessary one in the conventional apparatus, is made as short as possible in the present invention, thereby applying the developing solution as a continuous fluid onto the substrate at a lower flow rate, where the flow rate of the developing solution is desirably a minimum one capable of applying the developing solution as a continuous fluid. Consumption of the developing solution can be reduced and also the influence of surface tension on the substrate can be decreased thereby to rapidly extend the developing solution on the substrate surface and uniformly apply the developing solution onto the substrate.

Figure 3:
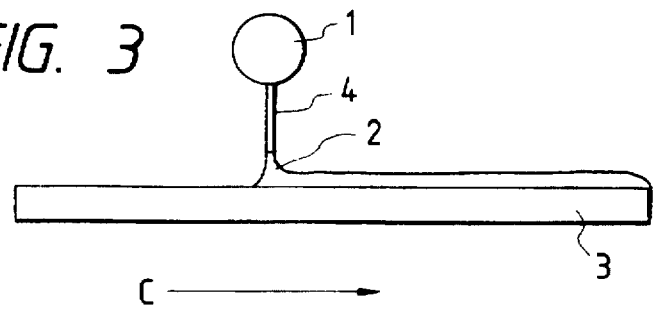
FIG. 3 is a schematic view showing application of a developing solution according to another embodiment of the present apparatus.
Figure 4:
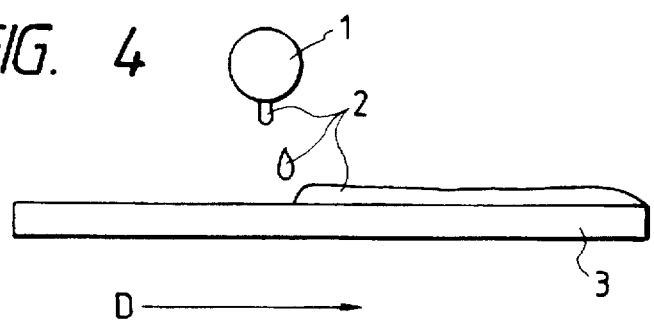
FIG. 4 is a schematic view showing application of a developing solution according to the conventional apparatus.
Figure 5:
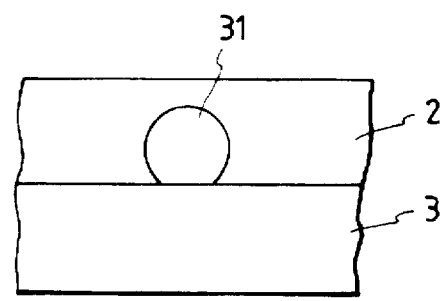
FIG. 5 is a schematic view showing a bubble trapped in the applied developing solution according to the conventional apparatus.
Figure 6:
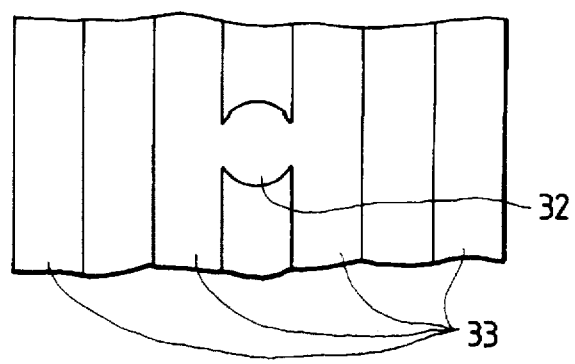
FIG. 6 is a schematic view showing a short circuit in wirings due to the bubble trapping.

Furthermore, a member 4 for applying the developing solution is provided between the pipe 1 with a nozzle for applying the developing solution and the substrate 3, as shown in FIG. 3. That is, the pipe 1 with a nozzle for applying the developing solution 2 is not transported to the substrate 3, but the lower end of the member 4 for applying the developing solution 2 is transported to the substrate 3. In the figure the substrate is transported in the arrow direction C. The member 4 for applying the developing solution for use in the present invention can be of any type, for example, of plate or columnar type or of mesh type such as cloth, so far as it can eject the developing solution as a continuous fluid onto the substrate from its lower end without trapping of bubbles.

In the foregoing embodiment, the pipe 1 with a nozzle for applying the developing solution is exemplified as a discharge route for the developing solution. It is also possible to use the discharge structure without any nozzle.

Figure 2:
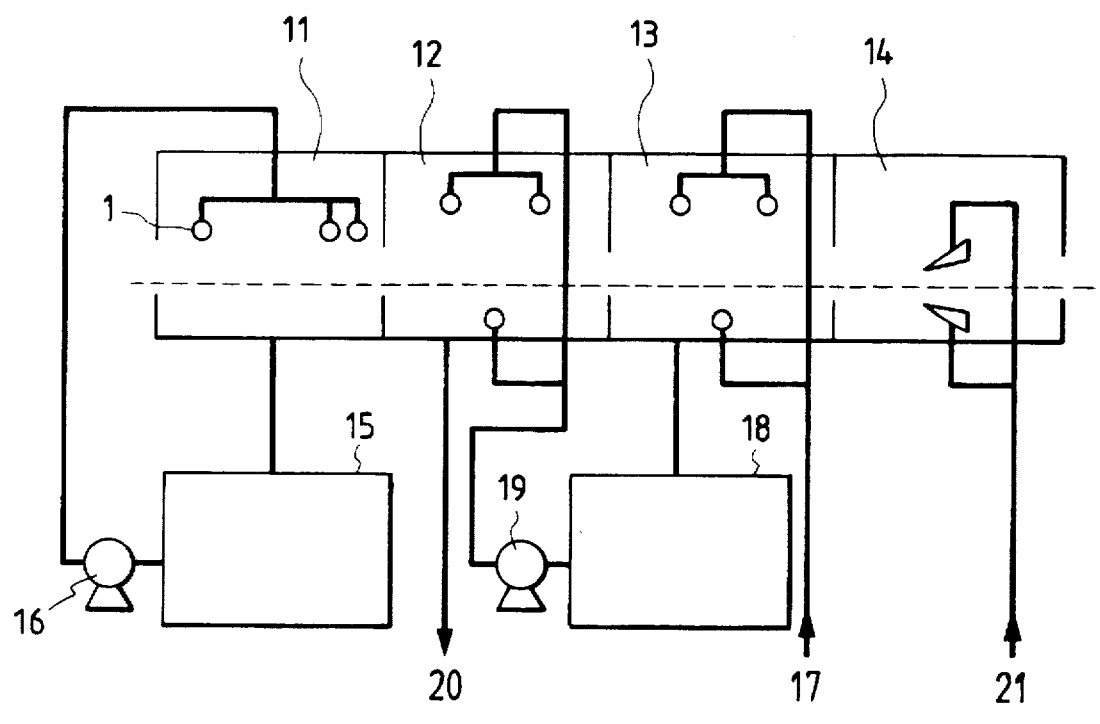
FIG. 2 is a schematic view showing a piece-by-piece, passing type development apparatus corresponding to large scale substrates according to one embodiment of the present invention.

FIG. 2 is a schematic view of a piece-by-piece, passing type development apparatus corresponding to large scale substrates according to one embodiment of the present invention. As shown in FIG. 2, the development apparatus consists mainly of three sections, i.e. a developing solution application section, a washing section, and a drying section. The entire apparatus is divided into a developing tank 11, a first water washing tank 12, a second water washing tank 13 and a drying tank 14. The substrate 3 is transported in the arrow direction B along the dotted line. The developing solution 2 stored in a developing solution tank 15 is fed to the pipe 1 with a nozzle for applying the developing solution provided in the developing tank 15 by a pump 16, and the developing solution 2 is ejected onto the substrate 3 from the nozzles for applying the developing solution to effect development, and is then returned to the developing solution tank 15 to form a recycle.

Water washing of the substrate is carried out in the first water washing tank 12 and the second water washing tank 13. Pure water from a pure water inlet 17 is used as second water washing in the second water washing tank, and the washing water from the second water washing tank 13 is stored in a water washing tank 18 and pumped by a pump 19 and used as first water washing in the first water washing tank 12. The washing water from the first water washing tank 12 is discharged to the outside through a water outlet 20.

Air is fed into the drying tank 14 from an air inlet 21 to blow the liquid away from the substrate 3 to dry the substrate 3.

EXAMPLE

Glass substrates, 300 mm square, were vapor deposited with Al to a thickness of 1 µm by sputtering, then applied with a positive type resist OFPR-800 (trademark of a product made by Tokyo Ohka Co., Ltd., Japan) to a thickness of 1.5 µm by spin coating and prebaked at 80° C., and exposed to light with MPA 1500 (trademark of a product, made by Canon K.K., Japan) through a mask at a line width of 30 µm and a line distance of 30 µm. The thus prepared substrates were subjected to evaluation of development, i.e. occurrence of short circuits with metallograph observation.

The tested development apparatus had a developing tank, 600 mm long, at a substrate transportation speed of 600 mm/min.

Tests were carried out with the substrates in the development apparatus while changing the pressure and the flow rate of the developing solution and the distance between the nozzles and the substrate. The pressure of the developing solution was adjusted by using the pump bypass valve, and the flow rate of the developing solution was adjusted by changing the nozzle. The results are shown in the following Table.

TABLE

|  | \multicolumn{7}{c}{Experiment No.} | | | | | | |
| --- | --- | --- | --- | --- | --- | --- | --- |
|  | 1 | 2 | 3 | 4 | 5 | 6 | 7 |
| Pressure of developing solution (kg/cm$^2$) | 0.05 | 0.05 | 0.05 | 0.50 | 0.05 | 0.50 | 1.00 |
| Flow rate of developing solution (l/min) | 10 | 10 | 30 | 30 | 10 | 30 | 10 |
| Distance between nozzle and substrate (mm) | 50 | 20 | 20 | 20 | 10 | 10 | 10 |
| State of ejected developing solution | Dropwise | Dropwise | Continuous | Dropwise | Continuous | Continuous | Dropwise |
| Number of short circuit occurrence (occurrences/substrate) | 150 | 50 | 0 | 30 | 0 | 0 | 10 |

By appropriate combination of the discharge pressure and the flow rate of the developing solution and the distance between the nozzle and the substance, the developing solution could be made not dropwise, but continuous, and no undeveloped residues could be generated, thereby resulting in no occurrence of short circuits in wirings.

What is claimed is:

1. A process for forming a wiring pattern which comprises:

forming a first layer of a wiring material on a substrate;

forming a resist layer on the first layer; and then subjecting the resist layer to imagewise light exposure and development to form a wiring pattern for said wiring material corresponding to the exposed resist layer on the substrate;

wherein the development step comprises the steps of:

applying a developing solution onto the resist layer in a continuous flow from a nozzle-shaped outlet portion of a developing apparatus while the resist layer passes below the developing solution outlet portion to rapidly extend the developing solution on the resist layer surface, wherein there is no entrapment of bubbles in the developing solution.

2. The process according to claim 1, further comprising adjusting the pressure and the flow rate of the developing solution and adjusting the distance between a pipe for electing the developing solution and the substrate.

3. The process according to claim 1, further comprising applying the developing solution onto the substrate at a minimum flow for forming the continuous flow.

* * * * *